United States Patent [19]

Ito et al.

[11] Patent Number: 5,064,711
[45] Date of Patent: Nov. 12, 1991

[54] SUBSTRATE OF A HYBRID IC, METHOD OF FORMING A CIRCUIT PATTERN AND APPARATUS OF FORMING THE SAME

[75] Inventors: Takatoshi Ito; Akihiro Yoshida; Kazunori Shimazaki, all of Kariya; Shuzo Hattori, 14-1, Aza-Musashizuka, Oaza-Nagakute, Nagakute-cho, Aichi-gun, Aichi-ken, all of Japan

[73] Assignees: Kabushiki Kaisha Toyoda Jidoshokki Seisakusho, Kariya; Shuzo Hattori, Aichi, both of Japan

[21] Appl. No.: 422,761

[22] Filed: Oct. 17, 1989

Related U.S. Application Data

[62] Division at Ser. No. 68,914, Jul. 1, 1987, Pat. No. 4,891,242.

[30] Foreign Application Priority Data

Jul. 5, 1986 [JP] Japan ................................. 61-158185

[51] Int. Cl.⁵ ............................................. B32B 9/00
[52] U.S. Cl. ..................................... 428/209; 428/323; 428/327; 428/328; 428/411.1; 428/901; 361/397; 174/250
[58] Field of Search .................. 361/397, 400–402; 174/250; 428/209, 323, 327, 328, 411.1, 901

[56] References Cited

U.S. PATENT DOCUMENTS 4,891,242  1/1990  Ito et al. ........................... 428/901

OTHER PUBLICATIONS

IEE Transactions, vol. CHMT-2, No. 4, 12-79, Thick Film Fine Pattern, Watanabe et al.

Primary Examiner—Patrick J. Ryan
Attorney, Agent, or Firm—Brooks Haidt Haffner & Delahunty

[57] ABSTRACT

A hybrid IC substrate has a substrate body and a retaining film which is formed on a surface of the substrate body. The retaining film enables a solution containing a circuit-element-forming material to permeate therethrough and retains the solution on the substrate body. The solution, which is expelled onto the hybrid IC substrate in the form of liquid drops, permeates the above-mentioned retaining film and becomes attached to the surface of the substrate body. Then, the hybrid IC substrate is baked. The retaining film is thus backed off, thereby forming a film of the circuit-element-forming material as a circuit pattern on the substrate body.

9 Claims, 8 Drawing Sheets

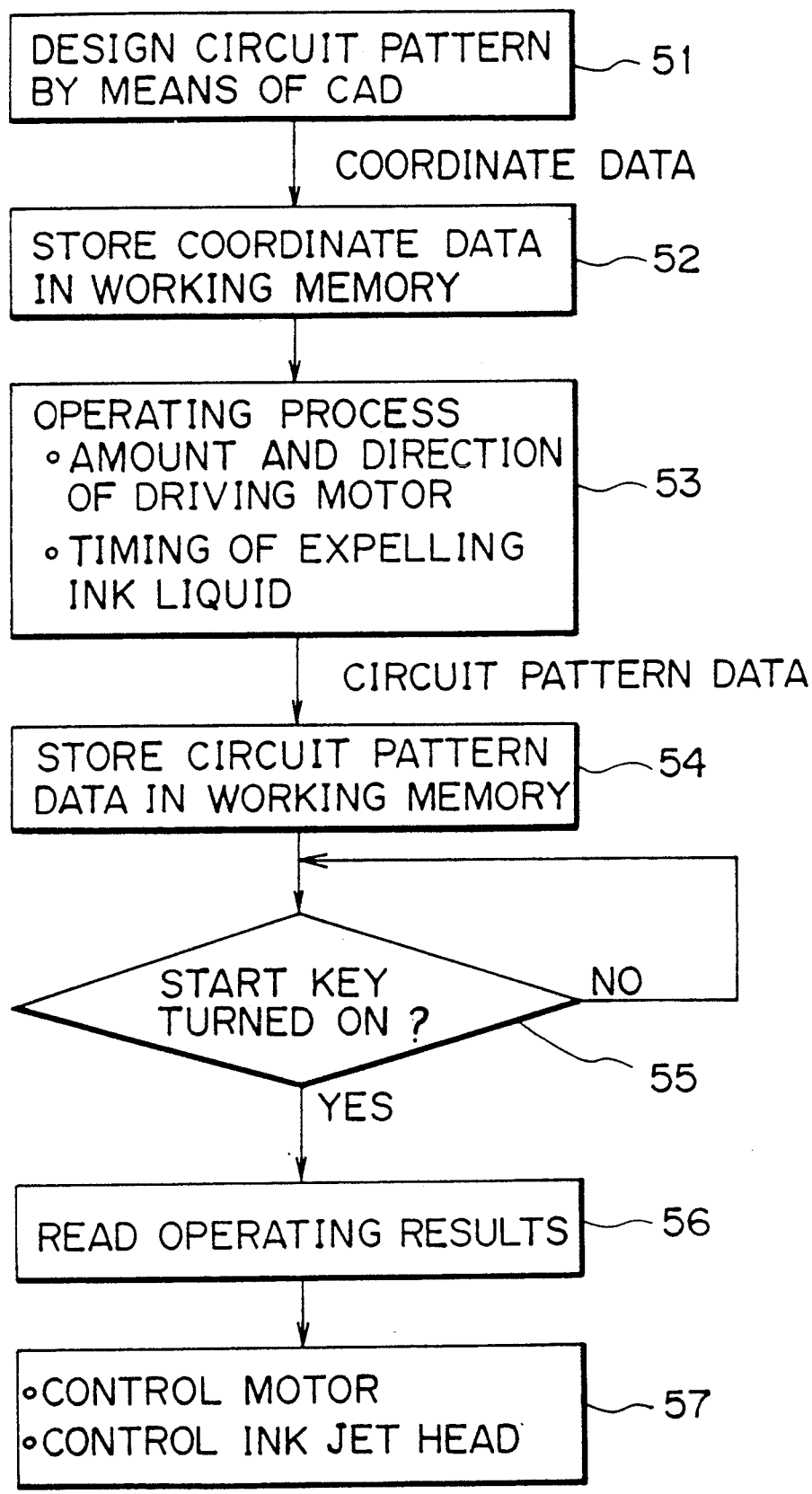

SUBSTRATE OF A HYBRID IC, METHOD OF FORMING A CIRCUIT PATTERN AND APPARATUS OF FORMING THE SAME

This is a division of application Ser. No. 068,914, filed July 1, 1987, now U.S. Pat. No. 4,891,242.

BACKGROUND OF THE INVENTION

The present invention relates to a substrate of a hybrid IC, a method of forming a circuit pattern by using the substrate and an apparatus for forming the same.

In the prior art, a screen printing method, for example, was used for forming a circuit pattern. The prior art method uses a substrate of alumina or similar material with a screen mask formed there, the screen mask having a circuit pattern formed thereon. The circuit pattern is formed on the substrate by means of paste which contains material for forming a circuit element. This method is like a mimeograph printing procedure.

However, this prior screen printing method requires many screen masks to form a complete circuit and a large amount of time to design and manufacture the screen masks. In addition, much of the paste attached to the screen mask or squeeze is disposed of. Therefore, a large quantity of the expensive paste is wasted.

SUMMARY OF THE INVENTION

An object of the present invention is to provide a hybrid IC substrate, a method of forming a circuit pattern and an apparatus for forming the same, which is completely different form the prior method.

According to a first feature of the present invention, a hybrid IC substrate body is coated with a retaining film, and the solution which contains materials for forming a circuit element permeates the retaining film and becomes attached to the hybrid IC substrate. The solution then remains at the point of attachment, being held in position by the retaining film.

In a second feature of the present invention, a predetermined pattern is drawn on a hybrid IC substrate using a solution which contains materials for forming a circuit element. After the solution has permeated the retaining film and become attached to the substrate's surface, the substrate is baked in an oven. The retaining film is thus baked off, thereby leaving a film of materials for forming a circuit element.

According to a third feature of the present invention, there is provided an apparatus for forming a circuit pattern comprising means for storing a solution containing materials for forming a circuit element, a drop-of-liquid expelling means for expelling in drop form the solution stored in the storing means, a substrate placing means for positioning a hybrid IC substrate the surface of which is coated with a retaining film, the retaining film allowing the solution expelled from the drop-of-liquid expelling means to permeate the retaining film at the position at which the solution is attached to the retaining film and also allowing said solution to be retained, means for moving the drop-of-liquid expelling means and said substrate placing means relative to each other, and means for controlling the timing of release of drops of liquid through the drop-of-liquid expelling means and the amount and direction of movement caused by the moving means based on the circuit pattern data, whereby a circuit pattern can be drawn on the hybrid IC substrate by using the solution containing materials for forming a circuit element.

BRIEF DESCRIPTION OF THE DRAWING

FIG. 12 is a flow chart showing a control operation of the forming apparatus shown in FIG. 5.

DETAILED DESCRIPTION OF THE PREFERRED EMBODIMENTS

Figure 1:
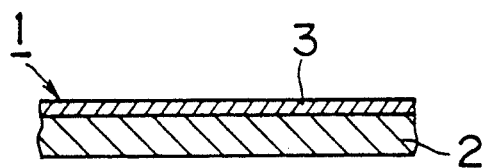
FIG. 1 is a sectional view of a portion of a hybrid IC substrate for use in the present invention.

FIG. 1 shows a sectional view of a major part of the hybrid IC formed substrate 1 of a hybrid IC formed in accordance with the present invention. The substrate body 2 comprises aluminium oxide, aluminium nitride, silicon nitride, silicon carbide and beryllium oxide, glass, enamel and zirconium oxide, etc. A retaining film 3, which allows a later explained ink liquid 4 to permeate therethrough and be retained therein, is formed on the surface of the substrate body 2. The retaining film 3 comprises acrylic resin, for example Seladic 26 (manufactured by Dai Nippon Ink Chemical Industry), and covers the substrate body 2 with a layer of almost constant thickness. The retaining film 3, which comprises this acrylic resin, is preferably formed using a spin coater to coat the resin on the substrate body 2 and cause it to dry. Alternatively, the resin may be sprayed in a moist form on the substrate body 2, or the substrate body 2 may be dipped into a solution of acrylic resin. Any method by which a retaining film 3 of acrylic resin is formed on the substrate body 2 can be employed in the invention. As the film thickness of acrylic resin becomes a main factor in determining the width of a line of a circuit pattern, it should be controlled so as to achieve an optimum value, as will be explained later.

Figure 2A:
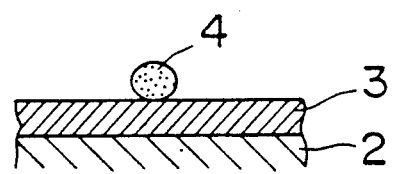
FIG. 2A to 2D are views which explain the process of forming a metal film on the substrate.
Figure 2B:
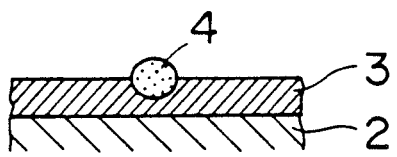
Figure 2C:
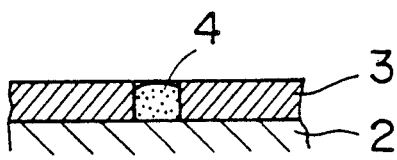

A paste (manufactured by Engelhard Minerals and Chemicals Corporation) of organic matter containing gold (Au) as a circuit-element forming material, is dissolved in an alpha-terpineol solution (for example, comprising 40% of the above-mentioned paste by weight and 60% of alpha-terpineol by weight and will be referred to as solution I). This forms the ink liquid 4. The ink liquid 4 is, as shown in FIG. 2A, dropped on a hybrid IC substrate (called a substrate hereinafter) 1 which comprises a substrate body 2 with a retaining film 3 on the upper surface.

The ink liquid or solution drop 4 falls on the retaining film 3 of the substrate 1. The retaining film 3 is dissolved by the alpha-terpineol solvent of the ink liquid 4, as the retaining film 3 is comprised of an acrylic resin. Thus, as shown in FIGS. 2A to 2D, the ink liquid 4 is able to permeate through the film 3 to the upper surface of the substrate body 2, and the position of the ink liquid drop 4 is maintained by the retaining film 3, which ensures that it does not spread out in a horizontal direction. The reason why the ink liquid 4 is suppressed from spreading in a horizontal direction is that all of the ink liquid 4 is quickly drawn into the retaining film 3 thereby ensuring that the spreading of the ink liquid 4 in a horizontal direction is completed at an early stage.

Suppression of spreading of the ink liquid drop 4 in a horizontal direction and its permeation through the film 3 is determined by the amount of the ink contacting the retaining film 3 and the thickness of the retaining film 3. For example, the thickness of the retaining film 3 is set at a thickness from several thousands of angstroms to several tens of microns and the ink liquid 4 drops are set at a diameter of twenty microns to three hundred microns. The substrate body 2 is heated to the appropriate temperature (about 100° C.) for the appropriate length of time by a heater. The solvent of the ink liquid 4 is thereby quickly evaporated, thus preventing the ink liquid 4 from spreading.

Figure 2D:
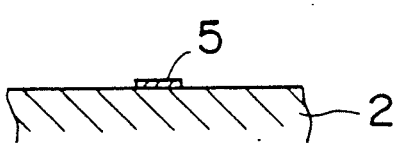

Next, the substrate 1 is baked in an oven (I.R. oven). The temperature of the oven is increased from ambient to a peak temperature (such as 850° C.) over a period of about ten minutes and, after the peak temperature is maintained for several minutes, the temperature of the oven is returned to ambient over a period of several minutes. The retaining film 3 formed on the substrate body 2 is baked off. The remaining liquid part of the ink liquid 4 is thereby evaporated leaving the gold (Au) part of the ink liquid 4, thus forming a circuit pattern made of gold on the substrate body 2 as a metal film 5, as shown in FIG. 2D.

Therefore, a predetermined circuit pattern is drawn by means of ink drops 4 on the hybrid IC substrate 1 and, when baked, a circuit pattern, consisting of the metal film 5 and having the same pattern as drawn on the substrate 1, is formed.

As described above, the embodiment of the present invention uses the substrate 1 having a retaining film 3 made of acrylic resin (Seladic 26 etc.), which is formed thereon and the ink liquid 4 obtained by dissolving a paste of organic matter including gold (Au) in an alpha-terpineol solution. With such an arrangement, a circuit pattern can be formed very simply as compared with the prior screen printing method. In addition, the ink liquid 4 is used only on the part on which a circuit pattern is intended to be drawn or formed and unnecessarily high consumption of the ink liquid 4 is avoided.

Moreover, as the maintenance and protective properties of the ink liquid 4 are excellent, irregularities in the surface such as concave or convex portions, and curved or wavy portions of the surface of the substrate body 2 do not affect the pattern formation and a hybrid IC of high reliability can be manufactured.

The hybrid IC substrate 1, having the above characteristic, is also made possible by appropriately selecting the materials of the retaining film 3 and the composition of the ink liquid 4, as will be described below.

The ink liquid 4 is composed of a chloroform solution in which a paste (manufactured by Engelhard Minerals & Chemicals Corporation) of organic matter including gold (Au) is dissolved, and the solution comprises, for example, 40% of the above mentioned paste by weight and 60% of chloroform by weight, and will be referred to as solution II hereinafter. The retaining film 3 may be made of acrylic resin (Seladic 26 etc.) which is dissolved by the chloroform as the solvent so that the ink liquid 4 reaches the surface of the substrate body 2, thereby maintaining its status. Then it can achieve the same effect as the above embodiment.

The ink liquid 4 is composed of a toluene solution in which a paste (manufactured by Engelhard Minerals & Chemicals Corporation) of organic matter including gold (Au) is dissolved. The solution comprises, for example, 40% of the above-mentioned paste by weight and 60% of toluene by weight, and will be referred to as solution III hereinafter. The retaining film 3 is composed of acrylic resin such as Seladic 26 or polyvinyl butyral (PVB) such as 3000K (manufactured by Electric Chemical Industry), which can be dissolved by toluene, and maintains a status such that the ink liquid 4 permeates the film 3 and reaches the substrate body 2. These replacements for the film 3 and ink liquid 4 will result in the same effect as in the above described embodiment.

The ink liquid 4 is composed of a WA-OIL solution (manufactured by Noritake Company Limited), in which a paste (manufactured by Noritake Company Limited) of organic matter including gold (Au) is dissolved of a butyl carbitol acetate (BCA) solution. The WA-OIL solution comprises, for example, 80% of the abovementioned paste by weight and 20% of WA-OIL by weight, and will be referred to as solution IV hereinafter. The retaining film 3 is composed of an acrylic resin such as Seladic 26 or polyvinyl butyral (PVB) such as 3000K, which is dissolved in WA-OIL or BCA solution and which enables the ink liquid 4 to permeate the retaining film 3 until it reaches the upper surface of the substrate body 2, thereby maintaining its status. Such a modification will produce effects similar to those produced previously.

The ink liquid 4 is composed of a water solution in which a soluble organic material is dissolved and retaining film 3 is composed of a polyvinyl alcohol which is dissolved by the water solution thereby enabling the ink liquid 4 to permeate until it reaches the surface of the substrate body 2. The ink liquid maintains a status such that it remains on the substrate body at the position where the ink liquid contacts the substrate body. Such modification likewise produces the same effect as the aforementioned embodiments.

The ink liquid 4 is composed of a solution (comprising, for example, 38.8% of silver neodecanate by weight, 4.85% of palladium diisobutyl dithiocarbamate by weight, 1.5% of copper ethylene diamine bisacetyl acetonate by weight, 27.5% of toluene by weight, and 27.5% of diethylene glycol dimethyl ether by weight, and hereinafter referred to as solution V) obtained by dissolving silver neodecanate (for example Ag 15%), palladium diisobutyl dithio-carbamate (for example Pd 1%) and copper ethylene diamine bisacetyl acetonate (for example Cu 0.3%) in toluene and diethylene glycol dimethyl ether. The retaining film 3 is composed of an ethyl cellulose 10 c.p.s. (manufactured by Kanto Chemical) or BM-S (Emalex B, manufactured by Sekisui Chemical). The present embodiment can achieve the same effect as the above embodiment. The ink liquid 4 is composed of a solution (comprising, for example, 36–41% of silver neodecanate by weight, 30–40% of toluene by weight, and 20–30% of alpha-terpineol by weight, and hereinafter referred to as solution VI) obtained by dissolving silver neodecanate (for example Ag 14% to 16%) in toluene and alpha-terpineol. The retaining film 3 is composed of an acrylic resin such as Seladic 26 or polyvinyl butyral (PVB) such as 3000K. The present embodiment can achieve the same effect as the above embodiment.

Figure 3:
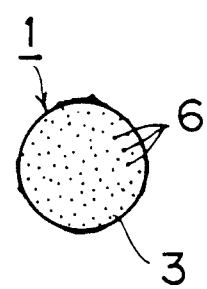
FIG. 3 is a front view of the main part of a different example of a retaining film used in another embodiment of the present invention.

Further, a retaining film or layer 3 may be a material for allowing a solution, including material (e.g. gold) for forming a circuit element, to permeate therethrough at the position at which the solution contacts the retaining film and for retaining the solution. Or, as shown in FIG. 3, the film or layer 3 may be a retaining film 3 having numerous holes 6. The liquid ink solution permeates and is retained within the holes 6. In this case, the radius of the hole 6 is sufficient to allow the ink liquid 4 to permeate into the holes and the density of the holes 6 may be appropriately selected, and is determined by the amount of the ink liquid 4 and the thickness of the film 5. Such retaining film 3 can be obtained by forming gelatin or cellulose, for example, into a porous material having numerous holes, each having a diameter of less than one thousand angstroms.

The retaining film 3 which serves as a retaining member for the ink liquid 4 may be formed of a liquid absorbing polymer other than acrylic resin. A high molecular absorbing polymer can be used as the liquid absorbing polymer. In this case the ink liquid 4 which contains the circuit element forming material is absorbed and retained at a position at which the ink liquid 4 contacts the retaining film 3, thereby providing the same effect as above.

In the above embodiment, Au is used as the circuit element forming material. Other conductive elements or materials may be used instead, such as Ag, Ag/Pd, Ag/Pt, Au/Pd, Au/Pt, Cu, W, and Pt. Resistor materials such as materials including ruthenium (for example, $RuO_2$, $Bi_2Ru_2O_7$, $Pb_2Ru_2O_6$, or $BaRuO_3$), materials including silver (for example, Ag/Pd(PdO)) and materials including indium (for example, $InO_3/SnO_2, InO_3$) may be used. Dielectric materials such as a glass paste and resin paste (for example, polyester )may also be used.

Figure 4A:
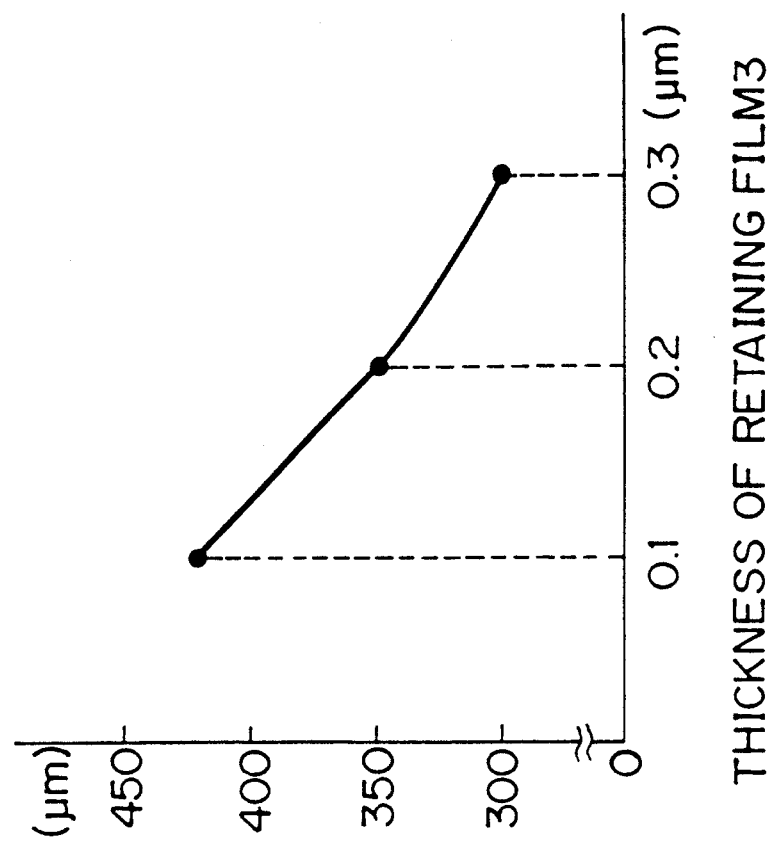
FIG. 4A and 4B are graphic diagrams showing one example of the relationship between the line width of a circuit pattern formed by the method of the present invention and the film thickness of the retaining film.
Figure 4B:
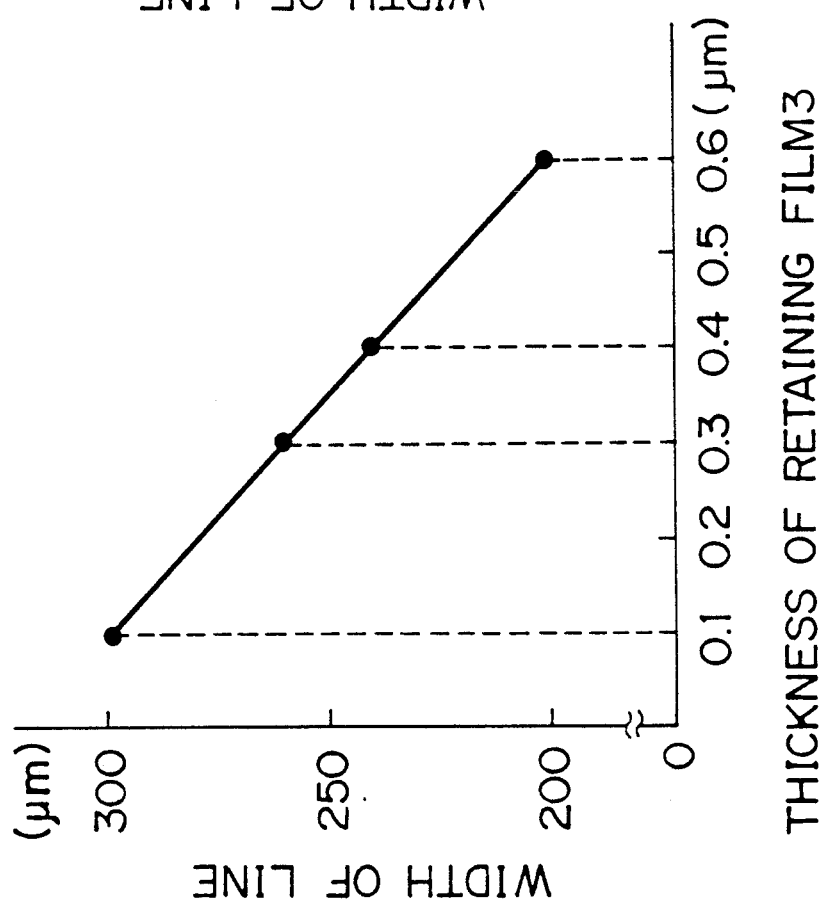

It is stated above that the line width of the circuit pattern formed by the above method has a direct relationship with the film thickness of the retaining film 3. One example thereof will be shown as follows. In the case where the retaining film 3 comprises ethyl cellulose 10 c.p.s. having a film thickness of 0.3 micron and the ink liquid 4 is made of the aforementioned solution V, a circuit pattern can be drawn with a line width of 180 microns. In the case where the retaining film 3 is 3000K and the ink liquid 4 is made of the solution IV, the relationship shown in FIG. 4A can be obtained between a film thickness of the retaining film 3 and the line width of the circuit pattern. On the other hand, in the case where the retaining film 3 is made of Seladic 26 and the ink liquid 4 is composed of the aforementioned solution IV, the relationship shown in FIG. 4B can be obtained.

Below is the explanation of an apparatus for forming a circuit pattern using the hybrid IC substrate 1 constructed as described above.

Figure 5:
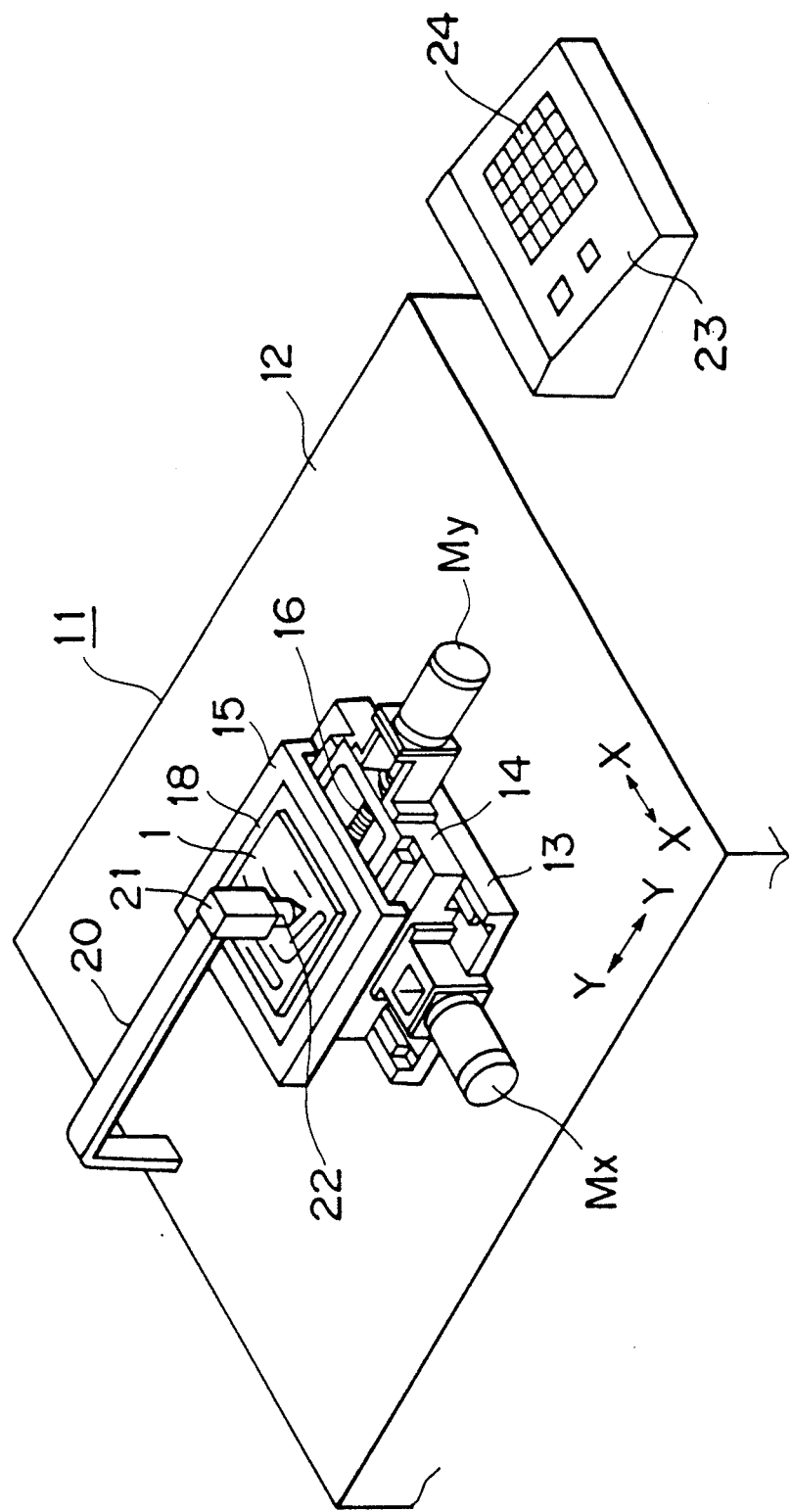
FIG. 5 is a perspective view of a forming apparatus according to the present invention.

FIG. 5 shows schematically the circuit-pattern-forming apparatus 11. An X-direction moving support 14, movable from right to left or vice versa, (X-axis direction) is provided on a base support 13 which is mounted on the table 12 of the apparatus 11. The X-direction moving support 14 is coupled by a gear to a ball screw which is connected to an X-direction driving stepping motor Mx which is attached to the left surface of the base 13. The stepping motor Mx drives the moving support 14 from right to left or vice-versa, i.e. in the X-axis direction.

A Y-direction moving support 15 is provided on a surface of the X-direction moving support 14 such that it can slide back and forth (in the Y-axis direction). The Y-direction moving support 15 is geared to a ball screw 16 which is connected to a Y-direction driving stepping motor My which is attached to the front side of the X-direction moving support 14. This enables the Y-direction driving stepping motor My to rotate in a clockwise and anticlockwise direction, so that the Y-direction moving support 15 is moved backward and forward or in a Y-axis direction.

Figure 6:
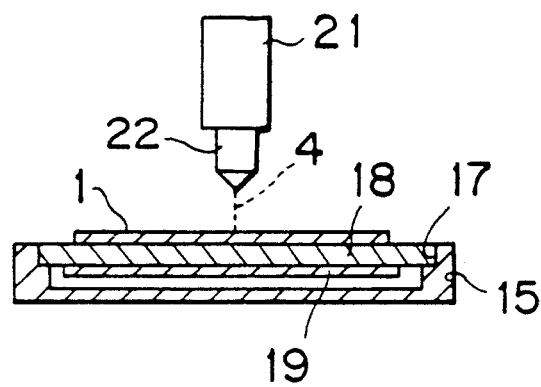
FIG. 6 is a sectional view of a moving support for use in the forming apparatus of FIG. 5.

As shown in FIG. 6, a depression or the convex portion 17 is formed on the upper surface of the Y-direction moving support 15. A fixed or stationary support 18 made of aluminium is inserted into depression 17 so as to achieve a regular or flat surface equal to the upper surface of said moving support 15. The substrate 1 is fixed on the upper surface of the fixed support 18.

A heater 19 is attached to the lower surface of the fixed support 18 and the substrate is maintained at an appropriate temperature through the fixed support 18.

A forward extending L-shaped arm 20, is mounted at the rear of table 12. An ink jet head 22 which may be called as a liquid nozzle or producer, a liquid ejecting nozzle, a drop-of-liquid expelling device or a liquid spot producing device is provided at the foremost end of the arm 20 such that it is opposed to and faces the upper surface of the fixed support 18. The ink jet head 22 is equipped with a tank 21 for holding ink liquid 4 for drawing a circuit patterns the ink liquid having a paste (manufactured by Engelhard Minerals & Chemicals Corporation) as solute and an alpha terpineol as the solvent. Such ink liquids 4 are discussed hereinabove. The ink jet head 22 operates in accordance with control signals from a control apparatus (described below) and the ink liquid 4 transmitted from the tank 21 is directed onto the substrate 1 which is positioned on the top surface of the fixed support 18, as shown in FIG. 6.

By driving and controlling the X-direction and Y-direction driving stepping motors Mx and My and operating the ink jet head 22, it is possible for the ink liquid 4 to draw a circuit pattern on the upper surface of said substrate 1. An operation box 23 is provided in front of the circuit pattern forming apparatus 11. The operation of the keyboard 24 on the box 23 drives the motors Mx and My and the ink jet head 22 and draws a circuit pattern on the substrate 1.

Figure 7:
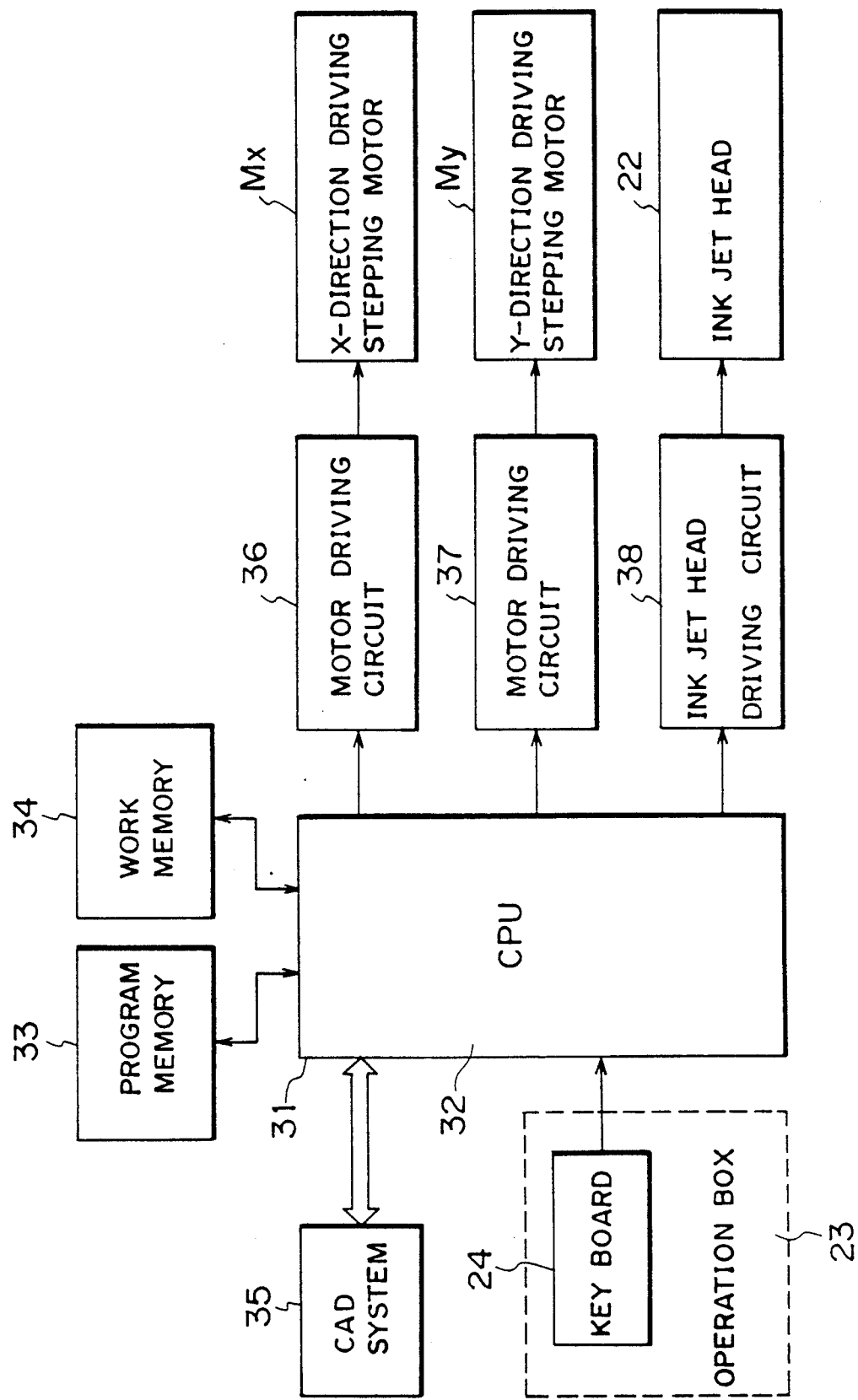
FIG. 7 is a block diagram of an electrical circuit of a forming apparatus of the present invention.
Figure 9:
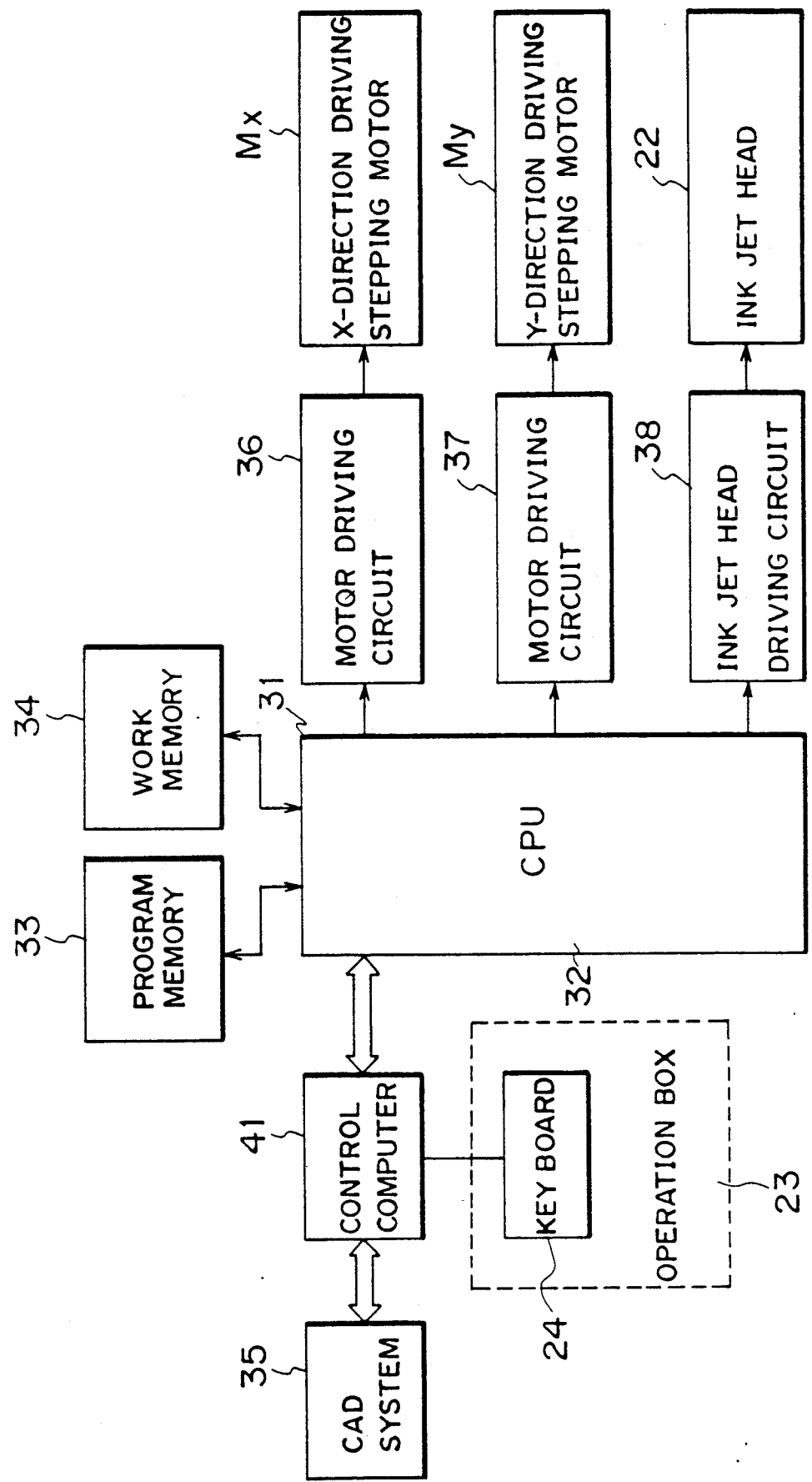
FIG. 9 is a block diagram of the electrical circuit of another embodiment of the present invention.

An electrical circuit for driving the motors Mx and My and the ink jet head 22 will be explained with reference to FIG. 7. As shown in FIG. 7, a microcomputer 31 coupled to the operation box 23 comprises a central processing unit 32 (which is referred to as CPU hereinafter), a program memory 33 comprising a read only memory (ROM) for storing a control program, a working memory 34 comprising a readable and rewrittable memory or random access memory (RAM) for storing results obtained from operational processing and circuit pattern data. The CPU 32 performs an operational process in accordance with the control program.

CPU 32 receives coordinate data transmitted from a CAD system of an external apparatus and stores it in a predetermined memory area of said working memory 34. Based on the coordinate data, data for enabling the ink jet head 22 to draw a circuit pattern by using the ink liquid 4 is operationally processed in the present forming apparatus. This circuit pattern data comprises a direction and amount of rotation of a stepping motor Mx for driving in an X-direction and a stepping motor My for driving in a Y-direction and comprises operation timing of the ink jet head 22.

Based on the pattern data, the CPU 32 controls the X-direction and Y direction driving stepping motors Mx and My through motor driving circuits 36 and 37 and controls the operation of the ink jet head 22 through a driving circuit 38 for the liquid producer. Instructions for process execution, given to the CPU 32, are made by a key operation of the keyboard 24.

The operation of the forming apparatus, as constructed above, will now be explained by referring to FIG. 12.

Suppose that coordinate data designating a circuit pattern to be formed by a CAD system 35 is formulated (step 51). The CPU 32 receives coordinate data formed by the CAD system 35 in accordance with a key operation on a keyboard 24, stores it in working memory 34 (step 52), and a simultaneously performs an operation process bases on the coordinate data (step 53), thereby forming circuit pattern data such as the driving amount of the motor and the liquid-expelling timing, and stores the data in a different area of the working memory 34 (step 54).

After the operator fixes the substrate 1 at a predetermined position on the fixed support 18, he operates a start key (not shown) on keyboard 24. In response to ON signals of the start key (step 55), CPU 32 reads the circuit pattern data formed as a result of the operation process from the working memory 34 (step 56), thereby controlling and driving the X and Y direction driving stepping motors Mx and My based on the circuit pattern data and driving the ink jet head 22 (step 57).

Accordingly, the substrate 1 on the fixed support 18 moves in an X and Y direction relative to the ink jet head 22 so that the ink jet head 22 can draw the circuit pattern by ejection of the ink liquid 4. During the relative movement, the ink jet head 22 produces the ink liquid 4, thereby enabling the circuit pattern formed by the CAD system 35 to be drawn on the substrate 1.

When the ink liquid 4 drops onto the retaining or protective film 3 of the substrate 1, the retaining film 3 allows the ink liquid 4 to permeate and/or dissolve through the film 3 onto the substrate body 2 at the position of the production of the liquid and maintains the status of the liquid 4 without spreading of the liquid 4 in a horizontal direction.

Then, as the substrate body 2 is warmed by the heater 19, the solution of the ink liquid 4 is rapidly evaporated, thereby completely preventing the ink liquid 4 from spreading.

When one pattern is formed, the following new pattern is drawn on the pattern previously drawn, in the same manner as described above, after the ink liquid 4 is changed to one containing a different circuit-element-forming material. When all of the patterns are drawn on the substrate 1, the substrate 1 is baked in an oven. The retaining film 3 formed on the substrate body 2 is baked off and the ink liquid 4 is resolved or decomposited, thereby enabling the solvent of the ink liquid 4 to be evaporated, and leaving the circuit-element-forming material on the substrate 1, as shown in FIG. 2D. The circuit-element-forming material (i.e. a conductor such as Au) is formed on the substrate 5, thereby resulting in a formation of a circuit pattern for a hybrid IC.

As described above, the present embodiment makes it possible to draw a circuit pattern on the substrate 1 with ease merely by operating the formation apparatus 11 based on a circuit pattern formed by, for example, a CAD system in advance.

Therefore, as the pattern can be directly formed on the substrate 1, a screen mask is not necessary, unlike the prior screen printing method. In addition, the great amount of expense and time which was formerly spent in manufacturing a mask can be saved and high speed drawing of the pattern becomes possible, thereby achieving a more highly automated system.

As the ink liquid 4 can be formed on an extremely small spot by the ink jet head 22, an extremely fine micro-pattern can be formed. Further, as only the necessary amount of the ink liquid 4 is used, this invention can achieve a great amount of cost reduction as compared to the screen printing method in which much of the paste is wasted.

Moreover, because of the excellent reproduction of the drawn pattern, variations of resistivity are remarkably small when the circuit-element-formation material is made of a resistance material. Thus, an extra working step such as a trimming (or adjusting) operation after the baking process can be eliminated.

Concave and convex portions of a pattern surface, which inevitably occur in a screen mesh, are not formed by the present invention, thereby enabling the formation of a low noise circuit.

In the prior screen printing method, a glass (insulating) layer is printed on a lower conductor and an upper conductor is formed thereon, thereby providing two-layer construction. However, there is a problem created by pin holes in the insulating layer which can cause a short circuit between lower and upper conductors. In order to avoid the problem, it is necessary to perform the printing of the glass repeatedly. By contrast, in the case of the present embodiment, the interval between liquid drops sequentially expelled from the ink jet head 22 is controlled or the number of drops is made to have a large density thereby preventing a pin hole from occurring even in the case of a single drawing of the pattern.

Figure 8:
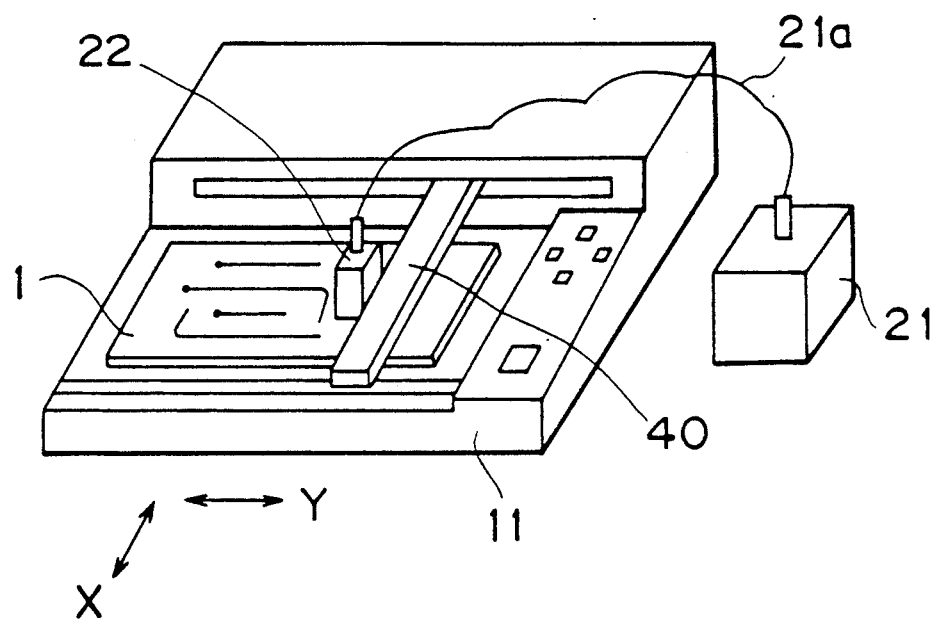
FIG. 8 is a perspective view of the forming apparatus according to another embodiment of the present invention.

The present invention is not limited to the above-described embodiments. For example, the ink jet head 22, as shown in FIG. 8, can be attached to a moving arm 40 which is movable in the Y-direction along slot 111 of table 11 and which is also movable in the X-direction perpendicular to the Y-direction in slot 111, and the ink jet head 22 can be moved in a controlled manner relative to the substrate 1, thereby drawing a circuit pattern. In this case, compared with the case where the substrate 1 is moved as described in the above embodiment, the liquid spot producing apparatus 22 can be moved with more ease, thereby achieving a high speed in drawing the circuit pattern.

In the previous embodiment, a tank 21 is coupled with the ink jet head 22. In contrast, the tank 21, as shown in FIG. 8, can be provided at an external position and the ink liquid 4 in the tank 21 can be supplied to the ink jet head 22 through a tube 21a.

In the above embodiments, the ink jet head 22 is not limited to a special type but may be made similar to an ink jet head such as that used for a printer of an ink jet type and/or may use an appropriate head such as a piezo electric head type ink jet head or a heat ink jet head, or the like.

Further, although the above embodiments directly receive coordinate data based on the circuit pattern designed, for example, by the CAD system 35, a control computer 41 may be, as shown in FIG. 8, provided between the CAD 35 and CPU 32, thereby receiving all of the data from CAD 35 in a batch and then transmitting the data to CPU 32 of the main apparatus 11 successively. Thus, the time for occupying the CAD system 35 can be shortened and several kinds of print pattern can be drawn automatically and more efficiently. The pattern data may be stored in an external data storing apparatus such as a floppy disc and may be read from the floppy disc for the purpose of an actual operation of the pattern data.

Figure 10:
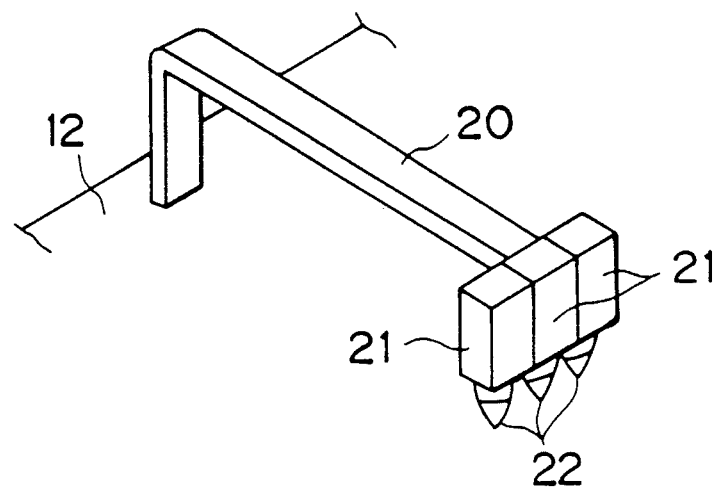
FIGS. 10 and 11 are perspective views of a main part of the forming apparatus which includes a plurality of devices for applying ink solution onto the hybrid IC substrate.
Figure 11:
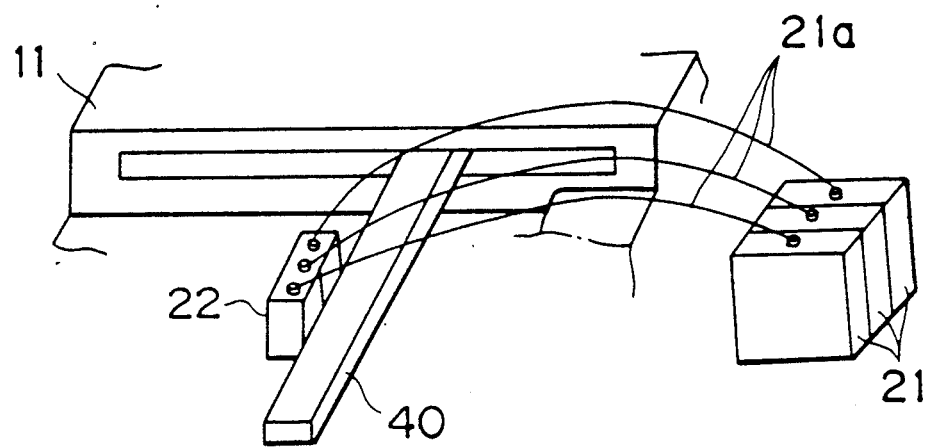

The forming apparatus 11 of the above embodiments is provided with the ink jet head 22. As shown in FIGS. 10 and 11, a plurality of liquid spot producing devices (i.e. nozzles) can be provided. In this case, different ink jet heads 22 can be used, for example, for circuit element forming materials such as conductor material, resistor material and dielectric material respectively. The ink jet head 22 are attached to the arm 20 or the moving arm 40 respectively. These circuit-element-formation materials are appropriately selected by the control circuit to be drawn as respective patterns on the film 3, so as to eliminate the necessity for changing the ink jet head 22 to new ones each time a different pattern is formed. This enables successive patterns to be formed on the substrate 1 and therefore allows the patterns to be formed in a shorter time period. In FIG. 10, different tanks 21 may be provided at the end of the arm 20, or instead, as shown in FIG. 11, different tanks 21 can be provided at different positions, and the ink liquid 4 may be applied to the corresponding ink jet head 22 through the tubes 21a respectively.

As described above in detail, the present invention forms the circuit pattern on the substrate in a way very different from the prior art and also the present invention can provide a circuit pattern at a very low cost, in a short time period, and a high precision.

What is claimed is:

1. A hybrid IC substrate comprising an IC substrate body and a non-photosensitive surface layer of a solution-retaining film formed on the substrate body where the solution-retaining film allows a solution that contains an electric-circuit-element-forming material and a solvent therefore upon application thereto to permeate therethrough until it reaches the substrate body while retaining said solution at the position at which the solution initially contacts said retaining film.

2. The hybrid IC substrate according to claim 1 wherein said retaining film is a film of an acrylic resin.

3. The hybrid IC substrate according to claim 1 wherein said retaining film is a film of polyvinyl butylal (PVB).

4. The hybrid IC substrate according to claim 1 wherein said retaining film is penetrable by alpha-terpineol.

5. The hybrid IC substrate according to claim 1 wherein said retaining film is penetrable by chloroform.

6. The hybrid IC substrate according to claim 1 wherein said retaining film is a film of polyvinyl alcohol (PVA).

7. The hybrid IC substrate according to claim 1 wherein said retaining film has numerous holes formed therein which absorb and retain said solution.

8. The hybrid IC substrate according to claim 1 wherein said retaining film is a film of a liquid absorbing polymer which absorbs and retains said solution.

9. An IC substrate comprising an IC substrate body and a non-photosensitive retaining film exposed on a surface of said substrate body for enabling a solution including an electric-circuit-element-forming material to permeate therethrough until it reaches said substrate body and retaining said solution at a position at which said solution initially contacts said retaining film.

* * * * *